United States Patent
Ning

(10) Patent No.: US 9,431,355 B2
(45) Date of Patent: Aug. 30, 2016

(54) SEMICONDUCTOR STRUCTURE AND METHOD FOR FORMING THE SAME

(71) Applicant: Semiconductor Manufacturing International (Shanghai) Corporation, Shanghai (CN)

(72) Inventor: Xianjie Ning, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/288,494

(22) Filed: May 28, 2014

(65) Prior Publication Data

US 2015/0162285 A1    Jun. 11, 2015

(30) Foreign Application Priority Data

Dec. 5, 2013    (CN) .......................... 2013 1 0655093

(51) Int. Cl.
| | | |
|---|---|---|
| H01L 21/70 | (2006.01) | |
| H01L 23/58 | (2006.01) | |
| H01L 21/768 | (2006.01) | |
| H01L 23/522 | (2006.01) | |
| H01L 23/532 | (2006.01) | |

(52) U.S. Cl.
CPC ....... *H01L 23/585* (2013.01); *H01L 21/76802* (2013.01); *H01L 21/76877* (2013.01); *H01L 21/76897* (2013.01); *H01L 23/5226* (2013.01); *H01L 23/53223* (2013.01); *H01L 23/53238* (2013.01); *H01L 23/53266* (2013.01); *H01L 2924/0002* (2013.01)

(58) Field of Classification Search
CPC ............. H01L 23/585; H01L 23/5226; H01L 23/53223; H01L 23/53238; H01L 23/53266; H01L 21/76897; H01L 21/76802; H01L 21/76877; H01L 2924/00; H01L 2924/0002

USPC .................................. 257/751, 508; 438/675
See application file for complete search history.

(56) References Cited

U.S. PATENT DOCUMENTS

| | | | | |
|---|---|---|---|---|
| 5,831,330 A | * | 11/1998 | Chang ........................... | 257/620 |
| 6,022,791 A | * | 2/2000 | Cook ..................... | H01L 21/768 257/E21.575 |
| 2003/0218254 A1 | * | 11/2003 | Kurimoto ......... | H01L 21/76807 257/758 |
| 2004/0150070 A1 | * | 8/2004 | Okada ...................... | H01L 22/32 257/508 |
| 2005/0098893 A1 | * | 5/2005 | Tsutsue ................. | H01L 23/564 257/758 |
| 2007/0069337 A1 | * | 3/2007 | Kuo ..................... | H01L 23/5283 257/620 |
| 2007/0090447 A1 | * | 4/2007 | Morimoto ............. | H01L 21/768 257/316 |

(Continued)

*Primary Examiner* — Vongsavanh Sengdara
(74) *Attorney, Agent, or Firm* — Anova Law Group, PLLC

(57) ABSTRACT

Various embodiments provide semiconductor structures and methods for forming the same. In an exemplary structure, a substrate has a device region, a seal ring region surrounding the device region, and a dielectric layer disposed thereon. A first seal ring structure is located within the dielectric layer on the seal ring region, and includes a plurality of first connection layers overlappingly disposed and separated by the dielectric layer. At least one first connection layer is formed by a plurality of discrete sub-connection layers. The first seal ring structure further includes a plurality of first conductive plugs between vertically adjacent first connection layers. A top of each first conductive plug is connected to an upper first connection layer. A bottom of each first conductive plug between at least two vertically adjacent first connection layers extends into the dielectric layer between horizontally adjacent sub-connection layers of a lower first connection layer.

15 Claims, 5 Drawing Sheets

(56) References Cited

U.S. PATENT DOCUMENTS

| | | | | |
|---|---|---|---|---|
| 2008/0191205 A1* | 8/2008 | Tsai | ........................ | H01L 22/34 257/48 |
| 2009/0008750 A1* | 1/2009 | Tokitoh | ................. | H01L 23/562 257/629 |
| 2010/0025824 A1* | 2/2010 | Chen | ..................... | H01L 23/585 257/620 |
| 2012/0038028 A1* | 2/2012 | Yaung | ................... | H01L 23/585 257/620 |
| 2012/0211748 A1* | 8/2012 | Miccoli | .............. | B23K 26/0057 257/52 |
| 2012/0313217 A1* | 12/2012 | Hung | ................... | H01L 23/585 257/532 |
| 2012/0326146 A1* | 12/2012 | Hui | ........................ | H01L 23/58 257/48 |

* cited by examiner

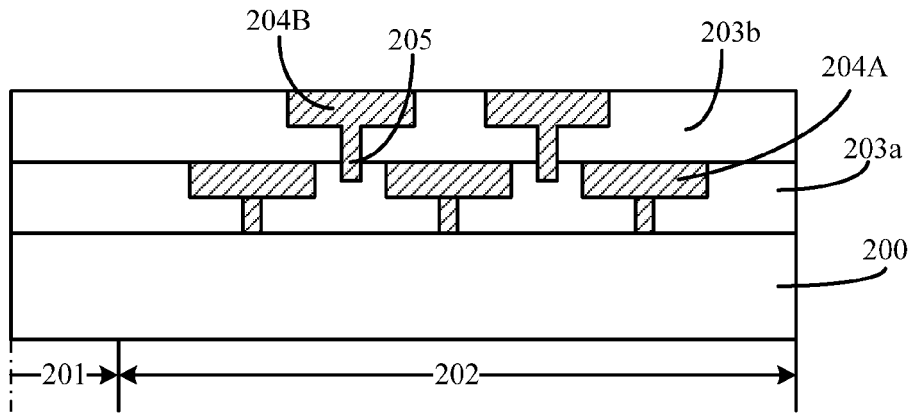

FIG. 10

| Provide a substrate, the substrate having a device region and a seal ring region surrounding the device region, a first dielectric layer being formed on the substrate and having a lower first connection layer at the surface of the first dielectric layer, the lower first connection layer including a plurality of discrete sub-connection layers | S201 |

| Form a second dielectric layer on the first dielectric layer and on the lower first connection layer | S202 |

| Form, in the second dielectric layer, via holes and openings on top of the via holes, the bottom of the via holes extending into the first dielectric layer between horizontally adjacent sub-connection layers of the lower first connection layer | S203 |

| Fill a conductive material in the via holes and the openings to form first conductive plugs in the via holes and to form an upper first connection layer in the openings, such that a first seal ring structure is formed | S204 |

FIG. 11

SEMICONDUCTOR STRUCTURE AND METHOD FOR FORMING THE SAME

CROSS-REFERENCES TO RELATED APPLICATIONS

This application claims priority to Chinese Patent Application No. CN201310655093.7, filed on Dec. 5, 2013, the entire contents of which are incorporated herein by reference.

FIELD OF THE DISCLOSURE

The present disclosure relates to the field of semiconductor fabrication technology and, more particularly, relates to semiconductor structures and methods for forming the same.

BACKGROUND

In integrated circuit (IC) manufacturing, fabrication of seal rings (also known as protective rings) is an important part of the semiconductor process. With the development of semiconductor technology, IC is made in the form of a chip. Specifically, semiconductor structures or semiconductor devices constituting an IC are formed on the surface of a semiconductor substrate or wafer. The semiconductor substrate or wafer is then sawed to form a plurality of separated chips. However, when the semiconductor substrate or wafer is sawed, mechanical stress is applied to the semiconductor substrate or wafer, and tends to generate cracks in the chips formed by sawing.

Furthermore, multiple semiconductor devices are generally formed on a semiconductor substrate. Thus, during a process of fabricating the semiconductor devices, stacked insulating films, e.g., inter-metal dielectric (IMD), and inter-layer dielectric (ILD), are formed by deposition. The stacked insulating films can be exposed at sidewall surfaces of a chip due to the chip sawing process. The stacked insulating films and their surface exposed at the sidewall surfaces of the chip can form a path for moisture penetration, and can result in malfunction of the semiconductor devices.

In order to prevent a semiconductor chip from being damaged by chip sawing process and to avoid degradation induced by moisture, a seal ring structure is formed between a device region and a saw Lane of each chip. Conventionally, the seal ring structure is formed at the same time during a process for forming a wiring layer and a contact portion. The formed seal ring structure has a multi-layer structure that is formed by alternately-stacked metal layers and insulating layers. Via holes are formed in each insulating layer for connecting adjacent metal layers.

However, existing seal ring structure still has poor performance in protecting device regions of a chip, and thus often affects properties of the chip formed by sawing. The disclosed methods and structures are directed to solve one or more problems set forth above and other problems.

BRIEF SUMMARY OF THE DISCLOSURE

One aspect of the present disclosure includes semiconductor structures. An exemplary structure includes a substrate having a device region and a seal ring region surrounding the device region. The substrate can have a dielectric layer disposed thereon. The structure can further include a first seal ring structure located within the dielectric layer on the seal ring region and surrounding the device region. The first seal ring structure can include a plurality of first connection layers that are overlappingly disposed. Vertically adjacent first connection layers of the plurality of first connection layers can be separated by the dielectric layer. At least one first connection layer of the plurality of first connection layers can be formed by a plurality of discrete sub-connection layers. Horizontally adjacent sub-connection layers of the plurality of discrete sub-connection layers can be separated by the dielectric layer. The first seal ring structure can further include a plurality of first conductive plugs between the vertically adjacent first connection layers. A top of each first conductive plug of the plurality of first conductive plugs can be connected to an upper first connection layer of the vertically adjacent first connection layers. A bottom of each first conductive plug between at least two vertically adjacent first connection layers of the plurality of first connection layers can extend into the dielectric layer between horizontally adjacent sub-connection layers of a lower first connection layer of the at least two vertically adjacent first connection layers.

Another aspect of the present disclosure includes methods for forming a semiconductor structure. In an exemplary method, a substrate can be provided. The substrate can include a device region and a seal ring region surrounding the device region. A first seal ring structure can be formed on the seal ring region. The first seal ring structure can surround the device region. The forming of the first seal ring structure can include the following steps. A first dielectric layer can be formed on the substrate. A lower first connection layer can be formed in the first dielectric layer. A surface of the lower first connection layer can be leveled with a surface of the first dielectric layer. The lower first connection layer can include a plurality of discrete sub-connection layers. Horizontally adjacent sub-connection layers of the plurality of discrete sub-connection layers can be separated by the first dielectric layer. A seal-ring-unit forming process can be performed. During the seal-ring-unit forming process a second dielectric layer can be formed on the first dielectric layer and the lower first connection layer. Further, a plurality of via holes and one or more openings on top of the plurality of via holes can be formed in the second dielectric layer. A bottom of a via hole of the plurality of via holes can extend into the first dielectric layer between the horizontally adjacent sub-connection layers. Still further, a conductive material can be filled in the plurality of via holes and the one or more openings, to form a plurality of first conductive plugs in the plurality of via holes and form an upper first connection layer in the one or more openings, such that the lower first connection layer, the plurality of first conductive plugs and the upper first connection layer form the first seal ring structure.

Other aspects or embodiments of the present disclosure can be understood by those skilled in the art in light of the description, the claims, and the drawings of the present disclosure.

BRIEF DESCRIPTION OF THE DRAWINGS

FIGS. 7-10 depict cross-sectional views of an exemplary semiconductor structure at various stages during fabrication in accordance with various disclosed embodiments; and FIG. 11 depicts a flow diagram of another exemplary method for forming a semiconductor structure in accordance with various disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Existing seal ring structure often has poor performance in protecting device region of a chip, and thus often affects properties of the chip formed by sawing. In the sealing ring structure, the interface between metal material and dielectric material has poor mechanical properties, and thus tend to cause cracking or delamination during a chip sawing process. As a result, the sealing ring structure can lose its ability of protecting the device region of the chip.

Figure 1:
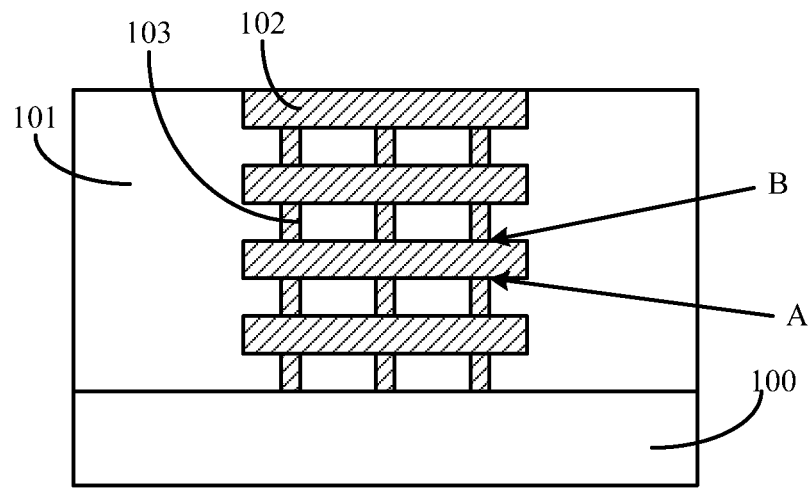
FIG. 1 depicts a cross-sectional view of a seal ring structure.

For example, FIG. 1 depicts a cross-sectional view of a seal ring structure. The structure includes a substrate 100 having a device region and a seal ring region surrounding the device region. The structure further includes a dielectric layer 101 on the surface of the substrate 100, a plurality of metal layers 102 stacked in the dielectric layer 101, and a plurality of conductive plugs 103 between every two adjacent metal layers 102. One conductive plug 103 has two ends connected to two adjacent metal layers 102, respectively.

Two adjacent metal layers 102 are separated from each other by the dielectric layer 101. The interface where the metal layer 102 contacts and the dielectric layer 101 has relatively weak mechanical strength. When the substrate 100 is being sawed, cracking or delamination tends to be generated at the interface between the metal layer 102 and the dielectric layer 101.

The two adjacent metal layers 102 are connected to each other via the conductive plug 103 therebetween. The conductive plug 103 and the metal layer 102 at the top of the conductive plug 103 can be formed simultaneously by a Damascene process (or Damascus process). Thus, the formed conductive plug 103 and the metal layer 102 at the top of the conductive plug 103 can be an integral structure.

For example, a process for forming the conductive plug 103 and the metal layer 102 at the top of the conductive plug 103 can include the following steps. A first metal layer 102 and a first dielectric layer 101 have been previously formed. Another dielectric layer 101, i.e., a second dielectric layer 101, can be formed on the previously-formed metal layer 102 and the previously-formed first dielectric layer 101. Via holes, e.g., through holes or through via holes, can be formed in the second dielectric layer 101. An opening can be formed at the top of the via hole to expose the via hole. A metal material can be filled in the opening and the via hole to form a conductive plug 103 in the via hole and form a second metal layer 102 in the opening. Therefore, an interface A where the conductive plug 103 contacts the second metal layer 102 at the top of the conductive plug 103 can have an increased or desired mechanical strength. The conductive plug 103 can prevent the delamination or cracking generated during the chip sawing process from extending from the interface A to the device region.

However, the conductive plug 103 is formed in the via hole that exposes the first metal layer 102, i.e., the conductive plug 103 and the first metal layer 102 at the bottom of the conductive plug 103 are formed in separate processes, an interface B where the conductive plug 103 contacts the first metal layer 102 at the bottom of the conductive plug 103 can have a weak mechanical strength. When subjected to increased stress or mechanical force, there can still be delamination or cracking at the interface B. Furthermore, the delamination or cracking can extend from the saw lane to the device region, and thus causes damage to the chip formed after sawing.

To solve one or more problems set forth above and other problems, various embodiments provide semiconductor structures. In an exemplary structure, in a first seal ring structure in a seal ring region, at least one first connection layer can be formed by a plurality of discrete sub-connection layers. A plurality of first conductive plugs can be located between two vertically adjacent first connection layers.

In addition, a bottom of the first conductive plug between at least two vertically adjacent first connection layers can extend into a dielectric layer between horizontally adjacent sub-connection layers. Because the bottom of the first conductive plug can extend into the first connection layer, an interface where the bottom of the first conductive plug contacts, i.e., extending into, the first connection layer can have an increased mechanical strength. As a result, at the interface between the bottom of the first conductive plug and the first connection layer, the first conductive plug can prevent delamination or cracking caused during a chip sawing process from extending into the device region. Thus, ability of the first seal ring structure to protect the device region can be enhanced.

Figure 2:
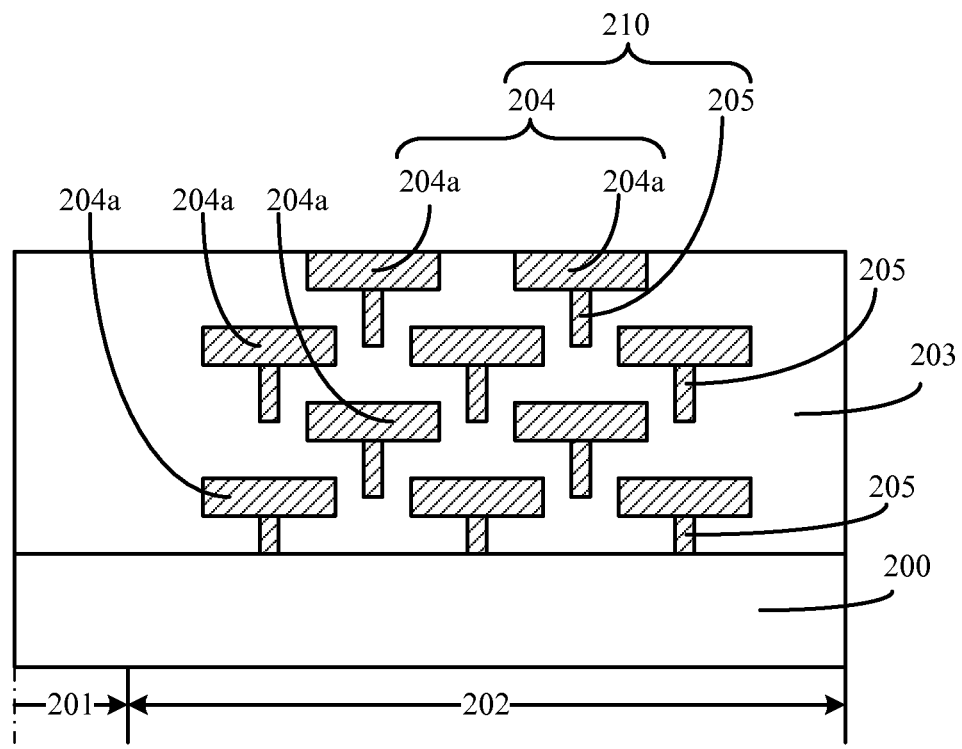
FIG. 2 depicts a cross-sectional view of an exemplary semiconductor structure in accordance with various disclosed embodiments.
Figure 3:
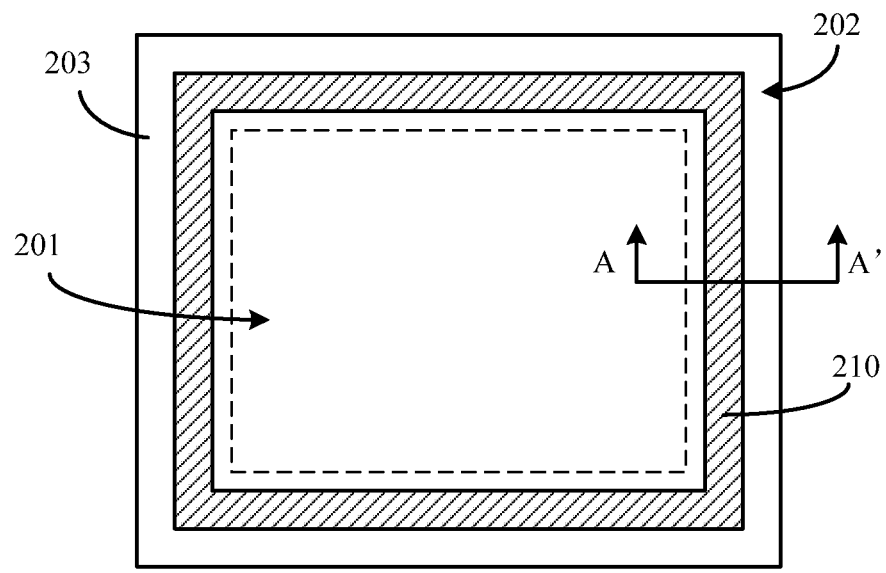
FIG. 3 depicts a top view of an exemplary semiconductor structure in accordance with various disclosed embodiments.

FIG. 3 depicts a top view of an exemplary semiconductor structure in accordance with various disclosed embodiments. FIG. 2 depicts a cross-sectional view of the exemplary semiconductor structure along an AA' direction as shown in FIG. 3, in accordance with various disclosed embodiments. The exemplary semiconductor structure can include a substrate 200 having a device region 201, and a seal ring region 202 surrounding the device region 201. A dielectric layer 203 can be disposed on the surface of the substrate 200.

The structure can further include a first seal ring structure 210 within the dielectric layer 203 at the seal ring region 202, i.e. on the seal ring region 202 of the substrate 200. The first seal ring structure 210 can surround the device region 201.

The first seal ring structure 210 can include a plurality of first connection layers 204. The first connection layers 204 can be overlappingly disposed. Two vertically adjacent first connection layers 204 can be separated by the dielectric layer 203 therebetween. At least one first connection layer 204 can include (i.e., formed by) a plurality of discrete sub-connection layers 204a. Two horizontally adjacent sub-connection layers 204a can be separated by the dielectric layer 203 therebetween.

The first seal ring structure 210 can further include a plurality of first conductive plugs 205 between vertically adjacent first connection layers 204. The top of a first conductive plug 205 can be connected to a first connection layer 204. At least two vertically adjacent first connection layers 204 can have the bottom of the conductive plug 205 therebetween extending into the dielectric layer 203 between horizontally adjacent sub-connection layers 204a.

For example, in the example as shown in FIG. 2, two vertically adjacent first connection layers 204 can include an upper first connection layer 204 and a lower first connection layer 204. The upper first connection layer 204 may be an integral electrical interconnect layer, or may be formed by a plurality of discrete sub-connection layers 204a. The lower first connection layer 204 is formed by a plurality of discrete sub-connection layers 204a. The two vertically adjacent first connection layers 204 can have a plurality of first conductive plugs 205 therebetween. The bottom of each first conductive plug 205 can extend into the dielectric layer 203 between horizontally adjacent sub-connection layers 204a of the lower first connection layer 204. The top of the each first conductive plug 205 can be connected to the upper first connection layer 204. When the upper first connection layer 204 is formed by the plurality of discrete sub-connection layers 204a, the top of the each first conductive plug 205 can be connected to a sub-connection layers 204a of the upper first connection layer 204. In one embodiment, the top of the each first conductive plug 205 can be respectively connected to one sub-connection layer 204a of the upper first connection layer 204. In another embodiment, the top of more than one first conductive plug 205 can be connected to one sub-connection layer 204a of the upper first connection layer 204 (not shown).

More particularly, in the above semiconductor structure, the substrate 200 can include a silicon substrate, a silicon-germanium substrate, a silicon carbide substrate, a silicon-on-insulator (SOI) substrate, a germanium-on-insulator (GOI) substrate, a glass substrate, and/or a III-V Group compound substrate (e.g., silicon nitride, gallium arsenide, or the like).

In one embodiment, the substrate 200 can further include a saw lane region surrounding the seal ring region 202 and the device region 201. A chip circuit can be formed on the surface of the substrate 200 at the device region 201. The saw lane region can be at a position for a chip sawing process after the chip circuit is formed. Multiple device regions 201 on the substrate 200 can be separated from each other by the chip sawing process, to form independent chips. The saw lane region can be removed during the chip sawing process.

After the chip sawing process, a sidewall of the dielectric layer 203 formed on the substrate 200 is exposed. Thus, moisture or impurities tend to enter the device region 201 via the exposed sidewall of the dielectric layer to cause contamination of the chip circuit in the device region 201.

Further, during the chip sawing process, the substrate 200 having the circuit chip formed thereon can be subjected to significant mechanical force or stress. Thus, the circuit chip in the device region 201 can be damaged. Therefore, the seal ring region 202 can be formed between the device region 201 and the saw lane region. The seal ring region 202 can be used for forming the first seal ring structure 210. For example, the first seal ring structure 210 can be formed in the dielectric layer 203 on the seal ring region 202 of the substrate 200. The first seal ring structure 210 can be used for protecting the circuit chip in the device region 201 from contamination or damage.

The first seal ring structure 210 can be made of a metallic material containing, e.g., copper, tungsten, aluminum, cobalt, and/or nickel. In addition, a barrier layer can be formed at the interface where the first seal ring structure 210 contacts the dielectric layer 203. For example, the barrier layer can be formed in the dielectric layer 203 and surround the first seal ring structure 210. The barrier layer can be made of a material containing one or more of titanium, titanium nitride, tantalum, and tantalum nitride. The barrier layer can be used for preventing metallic material from diffusing into the dielectric layer 203.

In one embodiment, each first connection layer 204 of the first seal ring structure 210 can include a plurality of discrete sub-connection layers 204a. The sub-connection layers 204a of the same first connection layer 204 can be separated by the dielectric layer 203 therebetween. Moreover, the sub-connection layers 204a of two vertically adjacent first connection layers 204 can have a staggered arrangement. For example, two vertically adjacent first connection layers 204 can include an upper first connection layer 204 and a lower first connection layer 204. Thus, positions of sub-connection layers 204a of the upper first connection layer 204 can correspond to positions of the dielectric layer 203 between sub-connection layers 204a of the lower first connection layer 204. On the other hand, positions of sub-connection layers 204a of the lower first connection layer 204 can correspond to positions of the dielectric layer 203 between sub-connection layers 204a of the upper first connection layer 204. That is, the sub-connection layers 204a in two vertically adjacent first connection layers 204 are not aligned vertically. Rather, the sub-connection layers 204a in two vertically adjacent first connection layers 204 may be arranged in a staggered formation. However, the sub-connection layers 204a in two alternating first connection layers 204 may be aligned vertically to have the same formation, i.e., aligned vertically to have an overlapped formation. Other arrangement may also be used.

Because the sub-connection layers 204a of two vertically adjacent first connection layers 204 can have a staggered arrangement, when the top of the first conductive plug 205 is connected to the first connection layer 204, the bottom of the first conductive plug 205 can extend into the dielectric layer 203 between horizontally adjacent sub-connection layers 204a. In one embodiment, the bottoms of substantially all of the plurality of first conductive plugs 205 can extend into the dielectric layer 203 between the horizontally adjacent sub-connection layers 204a. In addition, the bottom of the first conductive plug 205 can be electrically isolated from the horizontally adjacent sub-connection layers 204a by the dielectric layer 203. In another embodiment, the bottom of the first conductive plug 205 can directly contact the sub-connection layer 204a.

The bottom of the first conductive plug 205 can extend into the dielectric layer 203 between the horizontally adjacent sub-connection layers 204a. That is, the bottom of the first conductive plug 205 can extend into the first connection layer 204. Therefore, mechanical strength between the bottom of the first conductive plug 205 and the first connection layer 204 can be improved. Thus, cracking or delamination generated in the dielectric layer 203 during a chip sawing process can be prevented from extending into the device region 201. Although the bottom of the first conductive plug 205 is used, the top of the first conductive plug may also be used to extend into the dielectric layer 203 of the upper horizontally adjacent sub-connection layers 204a. That is, the top of the first conductive plug may also be used to extend into the dielectric layer 203 between horizontally adjacent sub-connection layers 204a of the upper first connection layer 204.

In one example, during a chip sawing process at the saw lane region, the substrate 200 and the semiconductor structure formed at the surface of the substrate 200 can be subjected to significant mechanical force or stress. Thus cracking or delamination tends to occur at the interface between the first connection layer 204 and the dielectric layer 203, especially at the interface between the first connection layer 204 and the dielectric layer 203 that is parallel to the surface of the substrate 200.

In the first seal ring structure 210, the first conductive plugs 205 and the first connection layer 204 at the top of the first conductive plugs 205 can be formed simultaneously by a Damascene process. Therefore, an interface where the top of the first conductive plugs 205 contacts the first connection layer 204 can have mechanical strength that is high enough to prevent the cracking or delamination generated at the saw lane region from extending into the device region 201.

Meanwhile, the bottom of the first conductive plugs 205 can extend into the dielectric layer 203 between horizontally adjacent sub-connection layers 204a, i.e., into the first connection layer 204. Therefore, mechanical strength at the positions where the bottom of the first conductive plugs 205 extends into the first connection layer 204 can be enhanced. Thus, the first conductive plugs 205 can be sufficient to prevent the cracking or delamination generated at the saw lane region from extending into the device region 201. Therefore, ability of the first seal ring structure 210 to protect the chip circuit at the device region 201 can be enhanced, to ensure desired performance of the circuit chip after the chip sawing process.

The number of the overlappingly-disposed first connection layers 204 can be determined according to the need of a specific process. In one embodiment, the number of the overlappingly-disposed first connection layers 204 can be consistent with the number of electrical interconnect layers in the device region 201 for forming the chip circuit. That is, the overlappingly-disposed first connection layers 204 can be disposed at the same time of forming the electrical interconnect layers in the device region 201. In one example, e.g., as shown in FIG. 2, the first seal ring structure 210 can include four overlappingly-disposed first connection layers 204, and each first connection layer 204 can include a plurality of discrete sub-connection layers 204a.

The first connection layer 204 can have an annular shape that surrounds the device region 201. For example, a top view of the first connection layer 204 can have an annular shape that surrounds the device region 201.

Each first connection layer 204 can include a plurality of discrete sub-connection layers 204a. The number of the discrete sub-connection layers 204a forming the each first connection layer 204 can range from about 1 to about 10. The distance between horizontally adjacent sub-connection layers 204a of the same first connection layer 204 can range from about 0.1 to about 3 micrometers. The width of each sub-connection layer 204a can range from about 0.1 to about 3 micrometers.

Further, the bottom of each sub-connection layer 204a can be connected to at least one first conductive plug 205. The number of the first conductive plugs 205 connected to the bottom of the each sub-connection layer 204a can be determined according to needs of a specific process. For example, the number of first conductive plugs 205 connected to the each sub-connection layer can range from about 1 to about 5. When multiple first conductive plugs 205 are connected to the bottom of a sub-connection layer 204a, the distance between horizontally adjacent first conductive plugs of the plurality of first conductive plugs 205 can be determined by appropriate design rule requirements.

In one embodiment, the first conductive plug 205 can be a strip-shaped via slot, i.e., a strip-shaped plug. For example, the first conductive plug 205 can have a strip shape in the direction parallel to the surface of the substrate 200. The strip shape can be similar to, or substantially the same as the shape of the sub-connection layer 204a in the direction parallel to the surface of the substrate 200. The length of the strip shape can be substantially equal to the length of the shape of the sub-connection layer 204a in the direction parallel to the surface of the substrate 200.

When the first conductive plugs 205 each have the strip shape in the direction parallel to the surface of the substrate 200, the first conductive plug 205 can substantially completely isolate the device region 201 from the dielectric layer 203 of the saw lane region. Thus, the formed first seal ring structure 210 can substantially completely isolate the device region 201 from the saw lane region, to better protect device region 201 and prevent the cracking or delamination generated at the saw lane region during a chip sawing process from extending into the device region 201.

Each sub-connection layer 204a and the first conductive plug(s) 205 connected to the each sub-connection layer 204a can form a seal ring unit. The first seal ring structure 210 can thus be formed by a plurality of seal ring units that are overlapping and staggered.

In one embodiment, a bottom first connection layer 204, i.e., a first connection layer 204 at the bottom of the plurality of first connection layers 204, can be connected to the substrate 200 via the first conductive plug(s) 205. That is, the sub-connection layers 204a of the bottom first connection layers 204 can be respectively connected to the substrate 200 via at least one first conductive plug 205.

In one embodiment, each of the plurality of first connection layers 204 can be formed by a plurality of sub-connection layers 204a. In addition, the bottom of the plurality of first conductive plugs 205 between two vertically adjacent first connection layers 204 can substantially all extend into the dielectric layer 203 between horizontally adjacent sub-connection layers 204a that are of the same first connection layers 204. However, in another embodiment, the bottom of the first conductive plugs 205 can be connected to the first connection layer 204 located at the bottom of the first conductive plugs 205.

Figure 4:
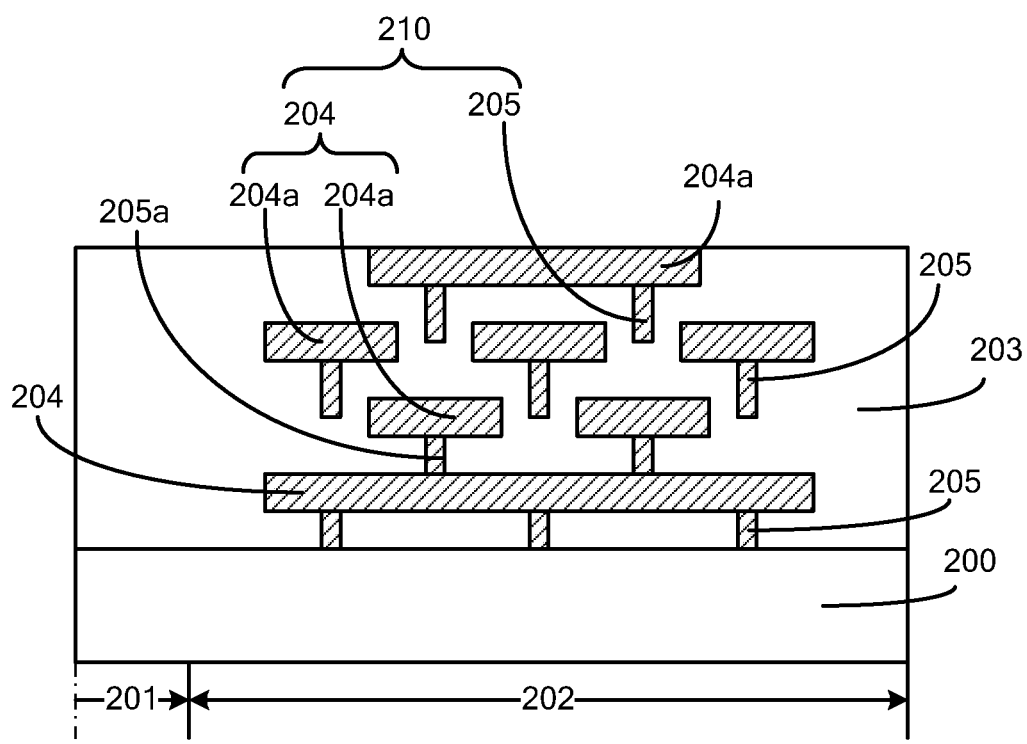
FIG. 4 depicts a cross-sectional view of another exemplary semiconductor structure in accordance with various disclosed embodiments.

FIG. 4 depicts a cross-sectional view of another exemplary semiconductor structure in accordance with various disclosed embodiments. As shown in FIG. 4, in one embodiment, among a plurality of first conductive plugs 205, the bottom of some of the first conductive plugs 205 can be connected to a first connection layer 204. For example, a bottom first connection layer 204, i.e., a first connection layer 204 at the bottom of the first connection layers 204 can include an integral electrical interconnect layer. Multiple first conductive plugs 205a can be located on the top surface of the bottom first connection layer 204. In addition, the bottom of the multiple first conductive plugs 205a can be connected to the bottom first connection layer 204. The top of the multiple first conductive plugs 205a can be connected to multiple sub-connection layers 204a.

The bottom first connection layer 204, and the first conductive plugs 205 that have the top portion connected to the bottom first connection layer 204, can be formed using any appropriate process for forming a typical sealing ring structure. The sub-connection layers 204a, and the first conductive plugs 205 and/or the first conductive plugs 205a that have the top portion connected to the sub-connection layers 204a can be provided at locations where cracking or delamination tends to occur during a chip sawing process. Thus, the first seal ring structure 210 can be formed by making a relatively small modification for a process of forming a typical sealing ring structure.

Figure 5:
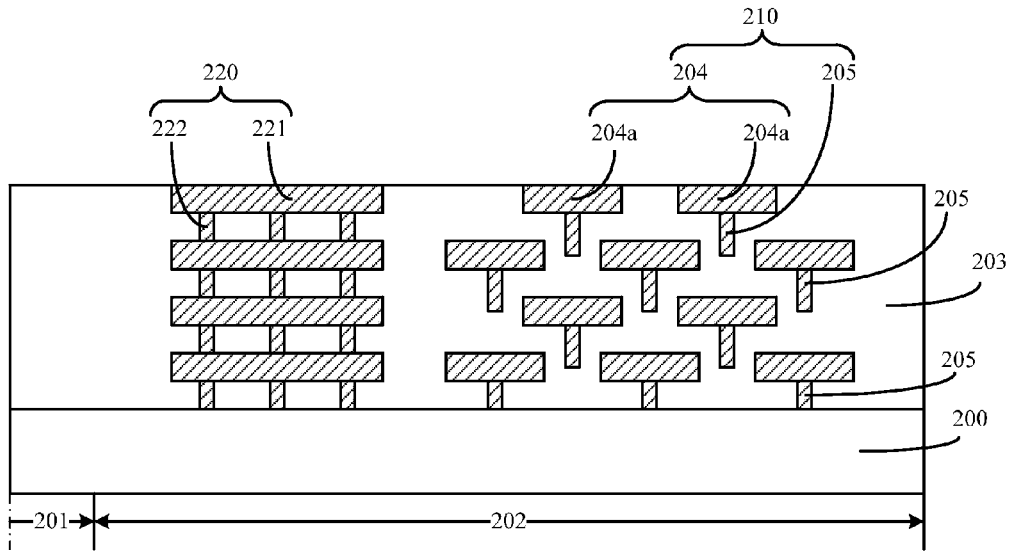
FIG. 5 depicts a cross-sectional view of another exemplary semiconductor structure in accordance with various disclosed embodiments.

FIG. 5 depicts a cross-sectional view of another exemplary semiconductor structure in accordance with various disclosed embodiments. As shown in FIG. 5, in one embodiment, the dielectric layer 203 on the seal ring region 202 can further have a second seal ring structure 220. The second seal ring structure 220 can surround the device region 201. In addition, the second seal ring structure 220 can surround the first seal ring structure 210, or the first seal ring structure 220 can surround the second seal ring structure 210.

The second seal ring structure 220 can include a plurality of second connection layers 221. The second connection layers 221 can be overlappingly disposed. Two vertically adjacent second connection layers 221 can be electrically isolated by the dielectric layer 203 therebetween. Second conductive plugs 222 can be located between the two vertically adjacent second connection layers 221. Both ends of each second conductive plug 222 can be connected to the two vertically adjacent second connection layers 221, respectively.

The first seal ring structure 210 and the second sealing ring structure 220 can be used together for protecting the chip circuit in the device region 201, and can further enhance the ability of the first seal ring structure 210 and the second sealing ring structure 220 to protect the device region 201. At the same of protecting the device region 201 from the occurring of cracking or delamination, moisture or impurities can be prevented from entering the device region 201. Thus, desired performance of the circuit chip can be ensured.

As disclosed in various embodiments, a semiconductor structure can include a first seal ring structure located on a seal ring region of a substrate. At least one first connection layer can be formed by a plurality of discrete sub-connection layers. A plurality of first conductive plugs can be located between two vertically adjacent first connection layers.

In addition, bottom of the first conductive plugs between at least two vertically adjacent first connection layers can extend into a dielectric layer between horizontally adjacent sub-connection layers. Because the bottom of the first conductive plug can extend into the first connection layer, an interface where the bottom of the first conductive plug contacts the first connection layer can have an increased mechanical strength. As a result, at the interface between the bottom of the first conductive plug and the first connection layer, the first conductive plug can prevent delamination or cracking caused during a chip sawing process from extending into the device region. Thus, ability of the first seal ring structure to protect the device region can be enhanced.

Figure 6:
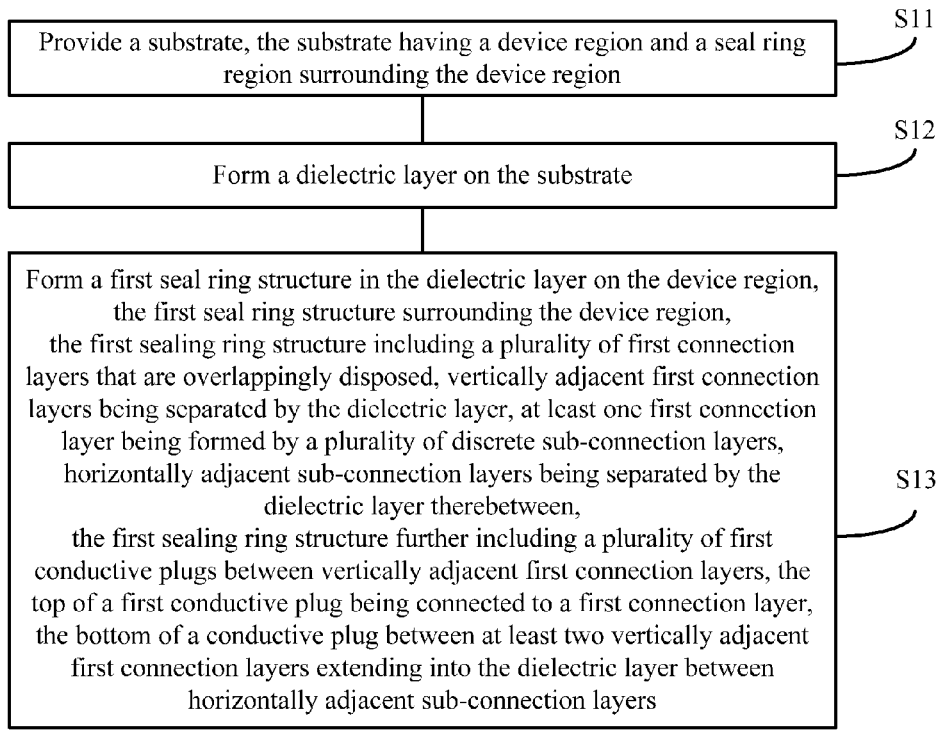
FIG. 6 depicts a flow diagram of an exemplary method for forming a semiconductor structure in accordance with various disclosed embodiments.

Accordingly, various embodiments also provide method for forming a semiconductor structure as described herein. FIG. 6 depicts a flow diagram of an exemplary method for forming a semiconductor structure in accordance with various disclosed embodiments. As shown in FIG. 6, the method can include the following exemplary steps.

In Step S11, a substrate is provided. The substrate has a device region and a seal ring region surrounding the device region.

In Step S12, a dielectric layer is formed on the surface of the substrate. In Step S13, a first seal ring structure is formed in the dielectric layer on the seal ring region. The first seal ring structure can surround the device region.

The first sealing ring structure can include a plurality of first connection layers. The first connection layers can be overlappingly disposed. Vertically adjacent first connection layers can be separated by the dielectric layer therebetween. At least one first connection layer can include a plurality of discrete sub-connection layers. Horizontally adjacent sub-connection layers can be separated by the dielectric layer therebetween.

The first sealing ring structure can further include a plurality of first conductive plugs between vertically adjacent first connection layers. The top of a first conductive plug can be connected to a first connection layer. The bottom of the conductive plugs between at least two vertically adjacent first connection layers can extend into the dielectric layer between horizontally adjacent sub-connection layers. The first conductive plugs and the first connection layer above the first conductive plugs can be formed simultaneously by a Damascene process.

FIG. 11 depicts a flow diagram of another exemplary method for forming a semiconductor structure in accordance with various disclosed embodiments. FIGS. 7-10 depict cross-sectional views of an exemplary semiconductor structure at various stages during fabrication in accordance with various disclosed embodiments. The semiconductor structure as shown in FIGS. 7-10 illustrate the process of forming a first conductive plug and a first connective layer on the top of the first conductive plug. Note that although FIGS. 7-10 depict structures correspond to the method depicted in FIG. 11, the structures and the method are not limited to one another in any manner.

Figure 7:
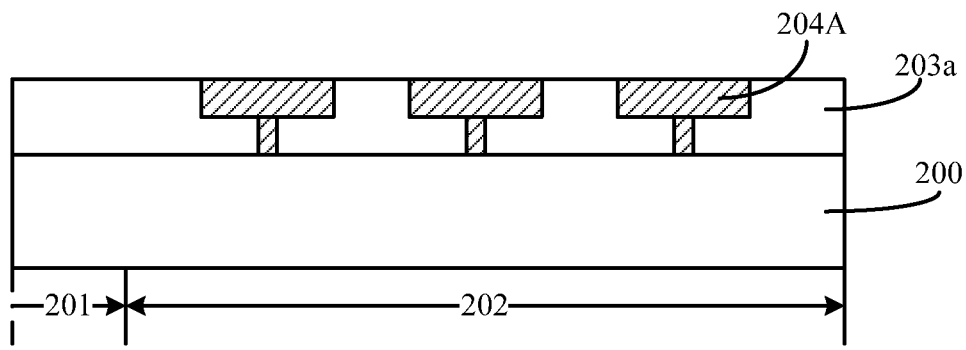

In Step S201 of FIG. 11 and referring to FIG. 7, a substrate 200 is provided. The substrate 200 has a device region 201 and a seal ring region 202 surrounding the device region 201. A first dielectric layer 203a is formed on the surface of the substrate 200. The first dielectric layer 203a can have a lower first connection layer 204A at the surface of the first dielectric layer 203a. The surface of the lower first connection layer 204A can be leveled with the surface of the first dielectric layer 203a.

The lower first connection layer 204A can include a plurality of discrete sub-connection layers. Horizontally adjacent sub-connection layers can be separated from each other by the first dielectric layer 203a. Optionally, the lower first connection layer 204A can be connected to the substrate 200 via a plurality of conductive plugs therebetween.

Figure 8:
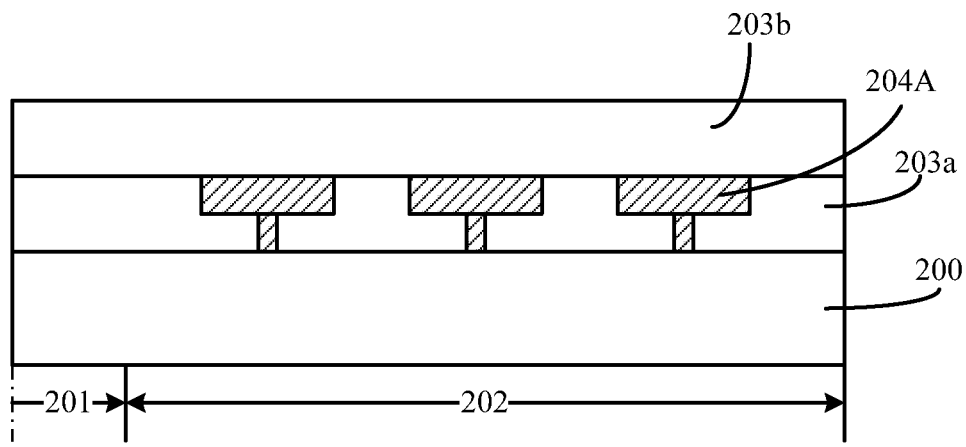

In Step S202 of FIG. 11 and referring to FIG. 8, a second dielectric layer 203b is formed on the surface of first dielectric layer 203a and the surface of the lower first connection layer 204A. The second dielectric layer 203b and/or the first dielectric layer 203a can be made of a material containing silicon oxide. A process of forming the second dielectric layer 203b and/or the first dielectric layer 203a can include a chemical vapor deposition process.

Figure 9:
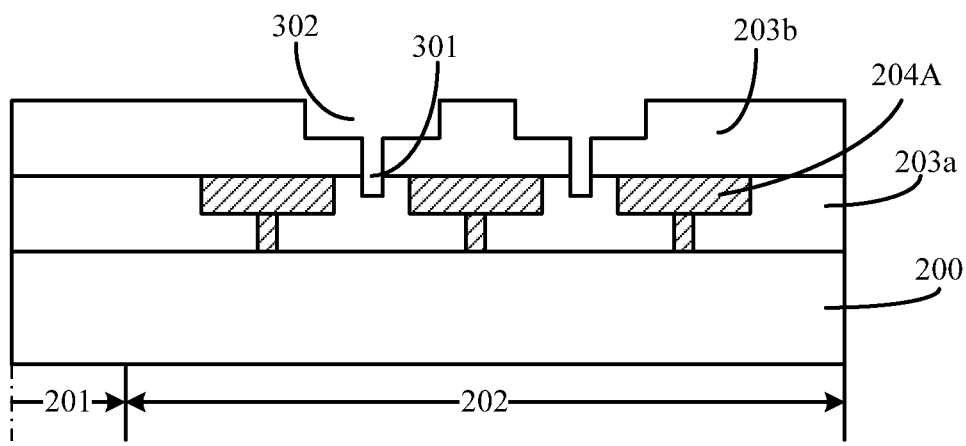

In Step S203 of FIG. 11 and referring to FIG. 9, via holes 301 exposing the surface of the sub-connection layers, and openings 302 on the top of the via holes 301 are formed in the second dielectric layer 203b. The bottom of each opening 302 can expose a via hole 301, and can be connected to the via hole 301. In various embodiments, the via holes 301 can expose the first dielectric layer 203a, e.g., as shown in FIG. 9.

For example, a process of forming the via holes 301 and the openings 302 can include the following steps. A first mask layer can be formed on the surface of the second dielectric layer 203b. The first mask layer can expose positions corresponding to the via holes 301. The second dielectric layer 203b can then be etched using the first mask layer as an etch mask, to form sub-openings in the second dielectric layer 203b. The first mask layer can be removed.

Further, a second mask layer can be formed on the surface of the second dielectric layer 203b. The second mask layer can expose positions corresponding to the openings 302. The second dielectric layer 203b and the bottom of the sub-openings can then be etched using the second mask layer as an etch mask, until the first dielectric layer 203a is exposed, or until the first dielectric layer 203a is exposed and a portion of the first dielectric layer 203a at the position of the sub-opening is etched.

Thus, the via holes 301 and the openings 302 are formed in the second dielectric layer 203b. In addition, the bottom of the via holes 301 can be lower than the surface (i.e., the top surface) of the lower first connection layer 204A, i.e., can extend into the first dielectric layer 203a between the sub-connection layers. A process of etching the second dielectric layer 203b can include, e.g., an anisotropic dry etching process.

In Step S204 of FIG. 11 and referring to FIG. 10, a conductive material is formed in the via holes 301 (e.g., as shown in FIG. 9) and the openings 302 (e.g., as shown in FIG. 9) to fill the via holes 301 and the openings 302, and thus to form first conductive plugs 205 in the via holes 301 and form the upper first connection layer 204B in the openings 302.

For example, a process of forming the first conductive plugs 205 and the upper first connection layer 204B can include the following steps. A conductive material can be formed on the surface of the second dielectric layer 203b and filling the via holes 301 and the openings 302, by using a deposition process or an electroplating process. The conductive material can be polished until the surface of the second dielectric layer 203b is exposed.

In various embodiments, in Step S201 of FIG. 11, the lower first connection layer 204A and the plurality of conductive plugs as shown in FIG. 7 can be formed in the first dielectric layer 203a using a process similar to the process for forming the first conductive plugs 205 and the upper first connection layer(s) 204B, e.g., as shown in FIGS. 8-10. That is, the first dielectric layer 203a can be formed on the substrate 200. Via holes corresponding to the size and position of the plurality of conductive plugs can be formed by exposing with the first mask. Sub-openings can be formed by etching the first dielectric layer 203a. Openings corresponding to the size and position of the lower first connection layer 204A can then be formed by exposing with the second mask. The openings and the sub-openings can be etched until the substrate 200 is exposed. A conductive material can be formed on the surface of the first dielectric layer 203a and filling the via holes and the openings, by using a deposition process or an electroplating process. The conductive material can be polished until the surface of the first dielectric layer 203a is exposed.

The conductive material can contain, e.g., copper, tungsten, aluminum, cobalt, and/or nickel. In addition, before the conductive material is formed, a polish stop layer can be formed on the surface of the second dielectric layer 203b and on the sidewall(s) and bottom surface of the via holes 301 and the openings 302. The polish stop layer can be made of a material containing one or more of titanium, titanium nitride, tantalum, and tantalum nitride.

After the first conductive plugs 205 and the upper first connection layer 204B are formed, processes depicted in FIGS. 8-10 (Steps S202-S204) can be repeatedly performed until the semiconductor structure is formed, e.g., as shown as in FIG. 2. Steps S202-S204 can form a seal-ring-unit forming process.

Because the first conductive plugs 205 and the upper first connection layer 204B on the top of the first conductive plugs 205 can be simultaneously formed, mechanical strength between the top of the first conductive plugs 205 and the upper first connection layer 204B is relatively strong. Meanwhile, because the bottom of the first conductive plugs 205 can extend into the lower first connection layer 204A, mechanical strength between the bottom of the first conductive plugs 205 and the lower first connection layer 204A can be enhanced. Therefore, when the formed semiconductor structure is used as a seal ring structure, the seal ring structure can have enhanced mechanical strength, and have improved ability of protecting the device region.

As disclosed in various embodiments, using the method for forming a semiconductor structure, in a first seal ring structure formed in a seal ring region, the bottom of the first conductive plugs between at least two vertically adjacent first connection layers can extend into a dielectric layer between horizontally adjacent sub-connection layers. Thus, an interface where the bottom of the first conductive plugs contacts the first connection layer can have increased mechanical strength. As a result, at the interface between the bottom of the first conductive plugs and the first connection layer, the first conductive plug can prevent delamination or cracking generated during a chip sawing process from extending into the device region. Thus, ability of the first seal ring structure to protect the device region can be enhanced.

In certain embodiments, a semiconductor structure is provided. The semiconductor structure includes a seal ring structure. The seal ring structure can have vias and metal sub-connection layers in a staggered arrangement, such that the seal ring structure can serve as a stoppage barrier to prevent or slow down crack propagation into the device region, i.e., the functional chip circuit. Generally, the crack is caused by a chip sawing process at a saw lane region and can propagate from the saw lane region.

As disclosed, the seal ring structure can include multiple first connection layers overlappingly disposed within a dielectric layer. Vertically adjacent first connection layers can be separated by the dielectric layer therebetween. Each first connection layer can be formed by multiple sub-connection layers.

The seal ring structure can further include multiple conductive plugs (i.e., via slots). The top of each conductive plug can be connected to an upper sub-connection layer. An upper sub-connection layer for a conductive plug refers to a sub-connection layer directly above the conductive plug, and can also be referred to as an upper metal line. Conductive plug(s) and the upper sub-connection layer connected to the conductive plug(s) can form a seal ring unit.

Thus, the seal ring structure can include multiple layers of seal ring units staggerly placed, e.g., as shown in FIG. 2. The bottom first connection layer, i.e., the lowest first connection layer, may or may not be connected to the top of conductive plugs to form seal ring units.

The conductive plug (i.e., via slot) of a seal ring unit can extend into the dielectric layer between horizontally adjacent sub-connection layers beneath the seal ring unit, e.g., as shown in FIG. 2). Such a conductive plug can be referred to an unlanded via slot. On the other hand, a landed via slot can refer to a conductive plug that directly contacts a sub-connection layer or a first connection layer beneath the seal ring unit.

The seal ring structure can include multiple layers of seal ring units. Each layer of seal ring units can have one or more unlanded via slot. An unlanded via slot can naturally result in a deeper via slot depth that can prevent lateral cracks propagating along metal/dielectric interface. The conductive plugs connected to the bottom first connection layer may not necessarily be unlanded via slots.

As shown in FIG. 5, the seal ring structure having the staggerly-placed seal ring units can be used solely or independently, or used in combination with non-staggerly-placed seal ring units (e.g., as shown in FIG. 1). Optionally, the number of unlanded via slots connected to the same upper metal line can be varied as needed. The number of staggerly-placed seal ring units can be varied depending on the requirements of actual applications.

Optionally, in one seal ring structure, some layers of multiple layers of seal ring units can include conductive plugs that are unlanded via slots, and other layers of multiple layers of seal ring units can include conductive plugs that are landed via slots. In the disclosed seal ring structure, the seal ring unit can be made of a material containing one or more of copper, aluminum, and tungsten.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
a substrate having a device region and a seal ring region surrounding the device region;
a dielectric layer disposed on the substrate;
a first seal ring structure located within the dielectric layer on the seal ring region and surrounding the device region, wherein the first seal ring structure includes:
a plurality of first connection layers that are overlappingly disposed, vertically adjacent first connection layers of the plurality of first connection layers being separated by the dielectric layer and being staggeredly arranged, wherein at least one first connection layer of the plurality of first connection layers is formed by a plurality of discrete sub-connection layers, horizontally adjacent sub-connection layers of the plurality of discrete sub-connection layers being separated by the dielectric layer;
a plurality of first conductive plugs between the vertically adjacent first connection layers, wherein:
a top of each first conductive plug of the plurality of first conductive plugs is connected to an upper first connection layer of the vertically adjacent first connection layers,
a bottom of at least one first conductive plug between at least two vertically adjacent first connection layers of the plurality of first connection layers extends into the dielectric layer that is between horizontally adjacent sub-connection layers of a lower first connection layer of the at least two vertically adjacent first connection layers, and the bottom of the at least one first conductive plug is not directly connected with any of the horizontally adjacent sub-connection layers, and
the plurality of first connection layers includes one bottom first connection layer, in direct contact with more than one first conductive plugs that are further in direct contact with the substrate under the dielectric layer.

2. The structure according to claim 1, wherein two vertically adjacent first connection layers of the plurality of first connection layers are formed by the plurality of discrete sub-connection layers, and the plurality of discrete sub-connection layers of a same first connection layer are separated by the dielectric layer.

3. The structure according to claim 1, wherein a number of the plurality of discrete sub-connection layers forming a first connection layer of the at least one first connection layer ranges from about 1 to about 10.

4. The structure according to claim 1, wherein a distance between the horizontally adjacent sub-connection layers ranges from about 0.1 micrometer to about 3 micrometers.

5. The structure according to claim 1, wherein a width of each sub-connection layer of the plurality of discrete sub-connection layers ranges from about 0.1 micrometer to about 3 micrometers.

6. The structure according to claim 1, wherein a bottom of each sub-connection layer of the plurality of discrete sub-connection layers is connected to at least one first conductive plug, and the each sub-connection layer and the at least one first conductive plug connected to the each sub-connection layer form a seal ring unit.

7. The structure according to claim 6, wherein a number of the at least one first conductive plugs connected to the each sub-connection layer ranges from about 1 to about 5.

8. The structure according to claim 1, wherein a bottom of a first conductive plug of the plurality of first conductive plugs is connected to a first connection layer of the plurality of first connection layers.

9. The structure according to claim 1, further including:
a second seal ring structure located within the dielectric layer on the seal ring region, wherein:
the second seal ring structure surrounds the device region, and
the second seal ring structure surrounds the first seal ring structure, or the first seal ring structure surrounds the second seal ring structure.

10. The structure according to claim 9, wherein the second seal ring structure includes:
a plurality of second connection layers that are overlappingly disposed, wherein two vertically adjacent second connection layers of the plurality of second connection layers are electrically isolated by the dielectric layer; and
a plurality of second conductive plugs between the two vertically adjacent second connection layers, wherein two ends of each second conductive plug of the plurality of second conductive plugs are respectively connected to the two vertically adjacent second connection layers.

11. The structure according to claim 1, wherein the plurality of first connection layers and the plurality of first conductive plugs are made of a material containing metal.

12. The structure according to claim 1, wherein the plurality of first connection layers and the plurality of first conductive plugs are made of a material containing copper, tungsten, aluminum, or a combination thereof.

13. The structure according to claim 1, wherein the substrate further includes a saw lane region surrounding the seal ring region and the device region.

14. The structure according to claim 1, further including:
a barrier layer formed at an interface where the first seal ring structure contacts the dielectric layer.

15. The structure according to claim 14, wherein the barrier layer is made of titanium, titanium nitride, tantalum, tantalum nitride, or a combination thereof.

* * * * *